United States Patent [19]

Richardson

[11] Patent Number: 4,706,019

[45] Date of Patent: Nov. 10, 1987

[54] ELECTRON BEAM TEST PROBE SYSTEM FOR ANALYZING INTEGRATED CIRCUITS

[75] Inventor: Neil Richardson, Mountain View, Calif.

[73] Assignee: Fairchild Camera and Instrument Corporation, Mountain View, Calif.

[21] Appl. No.: 798,592

[22] Filed: Nov. 15, 1985

[51] Int. Cl.[4] .................. G01R 31/28; H01J 37/26
[52] U.S. Cl. .................... 324/158 R; 324/158 D; 250/310; 250/311
[58] Field of Search ............ 324/158 R, 71.5; 250/310, 311, 398, 492.2

[56] References Cited

U.S. PATENT DOCUMENTS

| 3,628,012 | 12/1971 | Plows | 250/310 |
| 4,169,244 | 9/1979 | Plows | 324/158 |
| 4,646,344 | 2/1972 | Plows | 250/310 |

FOREIGN PATENT DOCUMENTS 0081295 11/1982 European Pat. Off. ........ 324/158 R

OTHER PUBLICATIONS

Fazekas et al., "Scanning Electron Beam Probes VLSI Chips"; Jul. 14, 1981; Electronics, vol. 54, No. 14; pp. 105-112.
Oatley, C. W., et al., Advanc. in Electronics & Electron Physics, vol. 21 (1965), pp. 182-247. Academic Press, Inc. New York, *Scanning Electron Microscopy.*
Kruit, P. et al., "Magnetic Field Paralleliser for 2-πelectronspectrometer and Electron-image Magnifier", *J. Phys. E. Sci. Instrum.*, vol. 16, 1983.

*Primary Examiner*—Ernest F. Karlsen
*Assistant Examiner*—Vinh P. Nguyen
*Attorney, Agent, or Firm*—Fitch, Even, Tabin & Flannery

[57] ABSTRACT

An electron beam test probe system for analyzing the operation of an integrated circuit is described. It includes a circuit for generating a test signal pattern and coupling the test signal pattern to the integrated circuit under test. It also includes an electron beam test probe for making potential measurements at specified points on the surface of the integrated circuit. These potential measurements can be displayed as an image of the surface of the integrated circuit or as a graph of the potential at a specified point on the surface of the integrated circuit as a function of time for times chosen with respect to the test signal pattern. The points at which potential measurements are made may be specified with reference to a schematic diagram of the integrated circuit. The schematic diagram may be inputted to the test probe system in a format which is consistent with that used by currently available circuit simulation programs. The points at which potential measurements are made may also be specified with reference to a specific location on the integrated circuit surface. The test probe system includes storage for a layout drawing of the surface of the integrated circuit in a format which is consisted with that used in currently available mask design programs.

19 Claims, 4 Drawing Figures

ELECTRON BEAM TEST PROBE SYSTEM FOR ANALYZING INTEGRATED CIRCUITS

BACKGROUND OF THE INVENTION

The present invention relates generally to the field of integrated circuit testing and more specifically to an electron beam test probe system for measuring the potentials on integrated circuits.

Improvements in the design and fabrication of integrated circuits now make it possible to construct integrated circuits with literally millions of transistors and tens of millions of conductors joining these transistors. This level of complexity in integrated circuits has led to significant difficulties in debugging a newly designed integrated circuit. These difficulties can best be described in the context of the following example which describes the typical steps carried out to create a new integrated circuit.

The process normally begins with a design engineer inputting the proposed circuit into a computer simulation program. The cost of design errors can be quite large if such errors are not detected until after the integrated circuit in question has been fabricated. Hence, circuit simulation programs are used to test the circuit. The SPICE program developed at the University of California at Berkeley, California is typical of such simulation programs. The integrated circuit in question is constructed from one or more circuit elements such as transistors. Using a design work station, each of these elements is inputted to the simulation program together with the interconnections between these elements. The interconnection list is often referred to as a NET list. The behavior of each of the circuit elements when various potentials are applied to specified terminals on the element in question is also inputted to the simulation program.

If the results of the simulation program indicate that the circuit design is theoretically correct, the design engineer then specifies the layout of the circuit on the silicon substrate. Each element in the integrated circuit is defined by a polygon in one or more masks. These masks are used to control the areas on the silicon substrate which are affected by various etching and deposition steps in the fabrication process used to produce the integrated circuit. The various polygons are inputted to a mask design program through a mask fabrication work station. It should be noted that the relative positions of the various elements on the silicon substrate as defined by these masks is, in general, significantly different from the relative positions of the various elements in the original schematic diagram inputted to the simulation program. Hence, the engineer can not merely use the input specifying the schematic diagram which was created for the simulation program to create the masks.

Once the masks have been defined, the layout is checked against the NET list data used in the simulation program using a design verification program. Typical of such programs is DRACULA program which may be obtained from ECAD, Inc. of Santa Clara, CA. This program takes as its input the layout data used to define the masks and the input data used to simulate the circuit using SPICE. In addition, the design verification program requires data specifying how each standard element in the circuit is constructed in terms of overlapping polygons on the various masks. For example, a typical field effect transistor consists of a thin line of polysilicon over a diffusion layer. The fabrication of the transistor is hence specified by polygons in the mask used to specify the diffusion layer and in the mask used to specify the polysilicon layer. Additional polygons specifying connections to this transistor will also be present in the masks used to define a metal layer. From the layout data, the design verification program generates a NET list which contains the interconnections between each of the standard elements in the integrated circuit. These standard elements are identified by "names" which are different than the "names" used in the simulation program data input. For example, transistor 1 in the simulation program data may be transistor 200 in the design verification program NET list. After constructing the NET list from the layout data, the design verification program then attempts to reconcile that list with the NET list used by the simulation program. If any inconsistencies are found, it reports these so that the layout data can be corrected.

Once the layout data has been inputted and verified, it is used to fabricate the desired integrated circuit. The resulting integrated circuit is then connected to a circuit exerciser which is used to test the circuit. The circuit exerciser provides input signals to the various input terminals of the integrated circuit and compares the signals on the various output terminals with those expected from a properly functioning circuit. If this test procedure indicates that the integrated circuit is not operating in accordance with its design, an engineer must determine the cause of the malfunction. Such a malfunction can result from either design or fabrication errors.

If the engineer were faced with the problem of debugging a circuit made from individual components such as transistors and resistors connected by wires, he could verify that each circuit element was present and then measure the potential as function of time at the inputs and outputs of each of the circuit elements to determine which elements were defective, if any. Performing the analogous operations on an integrated circuit is complicated by the minute size of the individual circuit elements and conductors connecting them. In principle, small mechanical probes connected to an oscilloscope or other potential measuring system can be used to measure the potential on a specific conductor. However, it is difficult to position such mechanical probes on a conductor without damaging the conductor. Furthermore, such mechanical probes may capacitively load the circuit being measured and hence alter the potential which the engineer wishes to measure. As a result, electron beam test probe systems have been developed to perform this type of measurement.

Prior art electron beam test probe systems are essentially modified scanning electron microscopes. They consist of an electron beam, a means for imaging the electron beam at a point on the integrated circuit, and a means for measuring the energy distribution of electrons leaving the point in question on the integrated circuit in response to the electron beam bombardment thereof. The electron beam test probe system may either be used as a scanning electron microscope or as a means for measuring the potential at a selected point on the surface of the integrated circuit. By using the electron beam test probe system in a scanning electron microscope mode, an image of the surface of the integrated circuit may be obtained and compared with the masks used to fabricate the integrated circuit in question. Such images allow the operator to check for obvious fabrication errors such as a missing conductor joining two circuit elements. By directing the electron beam at a conductor and examining the energy distribution of the secondary electrons produced in response to the electron beam bombardment of the conductor, the potential on the conductor at the point of bombardment may be deduced and compared with the expected potential at that point.

Because prior art electron beam test probe systems are essentially scanning electron microscopes, they have several problems which have limited their usefulness as circuit debugging tools. First, the means provided for mounting and positioning the integrated circuit with respect to the electron beam and detector are inadequate. The typical prior art electron beam test probe system consists of a scanning electron microscope and a stage for holding the integrated circuit under examination. The stage is used to hold the integrated circuit being examined and to move the integrated circuit relative to the electron beam. This movement is necessary, since the field of view of a scanning electron microscope is not sufficiently large to allow the entire integrated circuit to be viewed at once. In addition to holding the integrated circuit, this stage must also hold a probe card which contains the electrodes which are used to provide power and signals to the integrated circuit under test. The use of this stage for both of these functions leads to problems in maintaining the electrical connections to the integrated circuit under test. This probe card contains a number of small mechanical probes which must be precisely positioned on pads located on the periphery of the integrated circuit. Once positioned, the probe card and integrated circuit must be moved as a unit with no relative movement between them. Any movement of the integrated circuit relative to the probe card could result in the electrical connections provided by the probe card being interrupted. Such precise joint movement is difficult to obtain, since the probe card also contains wires which are connected to the circuit exerciser through the walls of the electron beam test probe system vacuum chamber. If one attempts to move the probe card and integrated circuit together, the forces applied to the probe card by these wires often results in movement of the probe card relative to the integrated circuit.

This problem is made still worse by the limited space available for the specimen being examined in the typical prior art system. Typically, the scanning electron microscope portion of the electron beam test probe system is mounted on top of a specimen chamber which in turn is mounted on a horizontal work surface. Since the electron microscope may not be conveniently moved, the specimen must be inserted sideways into the specimen chamber. This insertion process is further complicated by the need to place the integrated circuit as close as possible to the last lens in the electron microscope electron optical system. Hence, the space available for the inserting the wafer is quite limited. As a result, one must typically position the wafer containing the integrated circuit to be examined relative to the probe card and then insert the combined wafer and probe card sideways into the specimen chamber. This must be done without moving the wafer relative to the probe card. The wafer and probe card must then be attached to the stage for positioning relative to the electron beam. At best this is an awkward procedure.

Second, it is difficult to locate the point on the integrated circuit which corresponds to a given point in the schematic diagram of the circuit. At the commencement of the debugging procedure, the test engineer has only the results of the circuit exerciser tests to guide him in locating the source of the malfunction. These results are used to guess the most likely point in the schematic diagram of the circuit at which the malfunctioning component is located. He must then determine the physical location on the integrated circuit surface at which this component is located, position the integrated circuit so that the electron beam test probe system can view this location, and then examine the integrated circuit at the location in question. To carry out this procedure, he must first find the component in question in the NET list used in the simulation program. Then he must find the corresponding component in the layout data and determine the physical coordinates of this component relative to some known location on the integrated circuit surface such as the corner of the die on which the integrated circuit is fabricated. Finally, he must use the stage to position these coordinates within the field of view of the scanning electron microscope. If the component he has chosen is not the malfunctioning one, he must make another guess and repeat this process. In addition to being time consuming, this mode of operation is error prone, since, in general, the components in the layout data have different "names" than the corresponding components in the simulation program data.

Third, prior art electron beam test probe systems do not provide a convenient means for comparing the scanning electron microscope measurements with those expected from the layout and simulation program data. For example, once the desired point on the integrated circuit is located and an image of the surface created, the test engineer must compare it with the image expected from the layout data to determine if the components were correctly fabricated. At best, he has a copy of the masks generated from this data. Hence, he must compare an image on a cathode ray tube screen showing a small portion of the integrated circuit with a drawing of the entire mask on a piece of paper. Such visual comparisons are difficult to make.

Finally, the prior art electron beam test probe systems do not lend themselves to automated debugging. Since these systems do not include the layout and simulation program data used in the design and fabrication of the integrated circuit being tested, they must rely on the test engineer to determine each point to be examined using the above described time consuming procedures.

Broadly, it is an object of the present invention to provide an improved electron beam test probe system.

It is a further object of the present invention to provide an electron beam test probe system which allows locations on the integrated circuit under test to be specified with respect to the schematic diagram used in creating the integrated circuit.

It is a still further object of the present invention to provide an electron beam test probe system which is capable of automated circuit debugging.

It is yet another object of the present invention to provide an electron beam test probe system which allows the integrated circuit to be positioned relative to the scanning electron microscope without the danger of interrupting the probe card connections to the integrated circuit.

It is yet another object of the present invention to provide an electron beam test probe system which allows the test engineer to quickly compare the scanning electron microscope measurements with the results expected from the circuit and layout data used to fabricate the integrated circuit under test.

These and other objects of the present invention will become apparent from the following detailed description of the present invention and the accompanying drawings.

SUMMARY OF THE INVENTION

The present invention consists of an electron beam test probe system for analyzing the operation of an integrated circuit. The present invention includes a means for generating a test signal pattern and coupling said test signal pattern to the integrated circuit under test. It also includes an electron beam test probe for making potential measurements at specified points on the surface of said integrated circuit. These potential measurements can be displayed as an image of the surface of said integrated circuit or as a graph of the potential at a specified point on the surface of said integrated circuit as a function of time for times chosen with respect to the test signal pattern. The points at which potential measurements are made may be specified with reference to a schematic diagram of the integrated circuit. The schematic diagram may be inputted to the present invention in a format which is consistent with that used by currently available circuit simulation programs. The schematic diagram so inputted may be displayed on a cathode ray tube screen and the point on the integrated circuit at which measurements are to be made may be specified with reference to a point on the cathode ray tube screen.

The points at which potential measurements are made may also be specified with reference to a specific location on said integrated circuit surface. The present invention includes means for inputting a layout drawing of the surface of the integrated circuit in a format which is consisted with that used in currently available mask design programs. The layout drawing may be displayed on the cathode ray tube screen and points on the surface of the integrated circuit specified by reference to points on the cathode ray tube screen.

DETAILED DESCRIPTION OF THE INVENTION

Hardware used in the Present Invention

Figure 1:
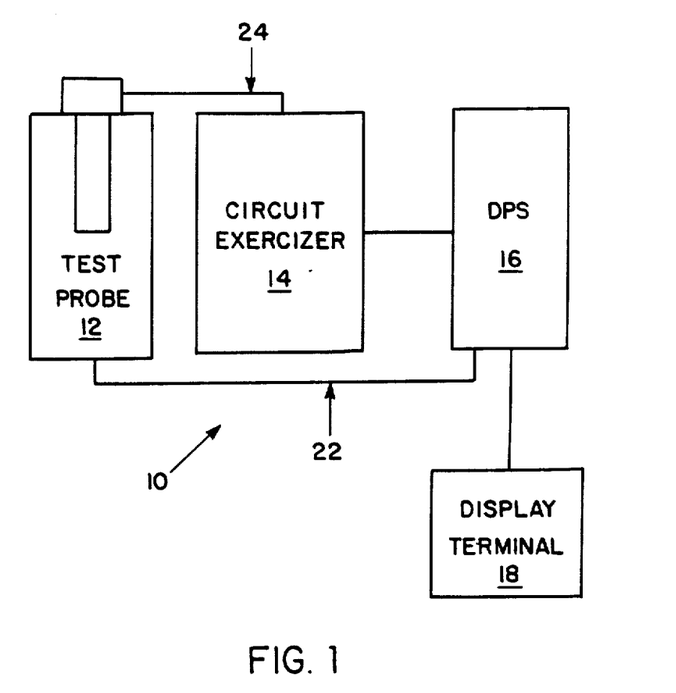
FIG. 1 is a block diagram of an electron beam test probe system according to the present invention.

A block diagram of an electron beam test probe system according to the present invention for analyzing an integrated circuit is shown at 10 in FIG. 1. The electron beam test probe system has three functional elements, an electron beam test probe 12, a circuit exerciser 14, and a data processing system 16 which includes a display terminal 18. The integrated circuit to be analyzed is placed in the electron beam test probe 12 so that potential measurements can be made at various points of the integrated circuit. The points at which said measurements are to be made are sent to the electron beam test probe 12 by the data processing system 16 over a bus 22. During the circuit analysis, a test signal pattern is applied to the integrated circuit by the circuit exerciser 14 which is connected to the integrated circuit being tested by a bus 24. The data processing system 16 may also be used to specify the test signal pattern used and the timing of said potential measurements relative to said test signal pattern. The electron beam test probe system is controlled by an operator who inputs commands through the display terminal 18.

Figure 2:
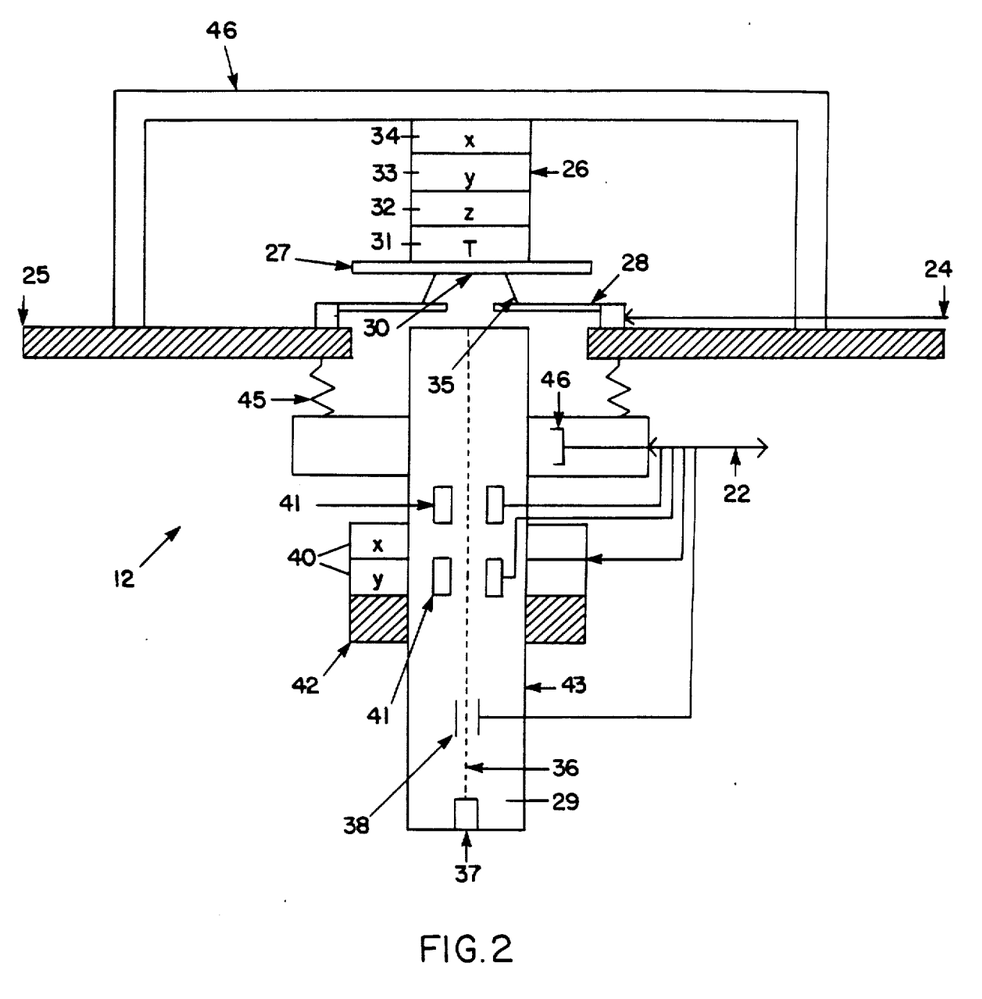
FIG. 2 illustrates the electron beam test probe used in the electron beam test probe system illustrated in FIG. 1.

The electron beam test probe 12 is shown in more detail in FIG. 2. The electron beam test probe 12 includes three components which are mounted to a surface 25: a stage 26; a probe card 28; and an electron beam column 29. A wafer 27 containing the integrated circuit 30 to be tested is mounted on the stage 26. The stage 26 is used to position the wafer 27 with respect to the probe card 28 which is used for coupling power and test signals to the integrated circuit 30. These test signals are received by the probe card 28 over bus 24. The power and test signals in question are coupled to the integrated circuit through mechanical probes. A typical such probe is shown at 35. These mechanical probes make contact with the integrated circuit 30 on pads located on the edge of the integrated circuit 30. The wafer 27 may be moved in relation to the probe card 28 by using one or more of four stage positioning means 31, 32, 33, and 34. These positioning means are used to position the integrated circuit 30 such that the probes 35 will make electrical connections to the integrated circuit 30. The position controls allow the wafer to be moved in either of two orthogonal directions, labeled x and y, parallel to the plane of the probe card 28, in a direction, labeled z, which is orthogonal to the plane of the probe card 28, and to be rotated about an axis parallel to the z direction. In the preferred embodiment, the positioning means 31, 32, 33, and 34 are micrometers. Manual control of the micrometers is acceptable, since the time to position the integrated circuit 30 relative to the probe card 28 is short compared to the time typically needed to analyze the integrated circuit 30. Embodiments in which each of the positioning means 31, 32, 33, and 34 include stepping motors which are controlled by signals on bus 22 will be apparent to those skilled in the art. Such embodiments would allow the data processing system 16 to perform the positioning of the integrated circuit 30 relative to the probe card 28.

The electron beam column 29 generates an electron beam along an axis 36 by accelerating electrons from an electron source 37. The electron beam may be turned on and off by the application of a potential to blanking electrodes 38. The blanking electrodes 38 receive such potentials under the control of the data processing system 16 on bus 22. When the electron beam is turned on, the electron beam leaves the electron beam column 29, passes through an orifice in the surface 25 and in probe card 28, and then strikes the integrated circuit 30 at the desired point.

The point at which said electron beam strikes the integrated circuit 30 is controlled by two positioning means 40 and 41. Two positioning means are needed, since the field of view of an electron beam column is, in general, too small to allow the entire integrated circuit 30 to be bombarded by the electron beam without moving the electron beam column. Positioning means 40 is used to define the field of view of the electron beam column 29 and positioning means 41 is used to define the point in said field of view at which the electron beam strikes the integrated circuit 30. Positioning means 40 determines the position of the electron beam column 29 relative the surface 25. The positioning means 40 is mounted on a structure 42 which is rigidly connected to the surface 25. Positioning means 40 allows the electron beam column 29 to be moved in either of two orthogonal directions, labeled x and y, parallel to the surface 25. In the preferred embodiment, the positioning means 40 consists of two micrometers, each including a stepping motor which is controlled by the data processing system 16 by appropriate signals on bus 22.

The second positioning means 41 is used to deflect the electron beam in either of two orthogonal directions parallel to the surface 25. In the preferred embodiment, these directions are the same as the directions employed by the positioning means 40. In the preferred embodiment, positioning means 41 includes two deflection coils which are controlled by the data processing system 16 by signals on bus 22. The positioning means 41 allows the electron beam to be positioned to an accuracy of less than one micron on the surface of the integrated circuit 30.

The bombardment of the integrated circuit 30 by the electron beam results in the production of secondary electrons whose energy distribution is related to the potential on the integrated circuit 30 at the point of bombardment. The secondary electrons travel in a direction parallel to the electron beam axis 36 in a direction opposite to that of the electron beam. The secondary electrons having energies greater than a predetermined energy are deflected into a secondary electron detector 46 by suitable potentials applied to electrodes in the electron beam column 29. These electrodes are described in detail in a co-pending application entitled "An Improved Electron Beam Test Probe for Integrated Circuit Testing", Ser. No. 766,905, which is incorporated herein by reference. The signals from the secondary electron detector 46 are coupled to the data processing system 16 on bus 22.

The electron beam and integrated circuit 30 must be in a vacuum for the electron beam test probe to function properly. The preferred embodiment employs a vacuum chamber consisting of three structures. The electron beam column 29 is enclosed in an airtight container having a boundary 43. This boundary is connected to the surface 25 by the second structure, a bellows 45, which allows the electron beam column 29 to move relative to the surface 25 without violating the integrity of the vacuum in the electron beam column 29. Finally, the stage 26 is mounted on a third vacuum boundary 46 which is connected to the surface 25. In the preferred embodiment, vacuum boundary 46 may be removed to gain access to the stage 26 and probe card 28.

The electron beam test probe used in the present invention significantly reduces two of the problems inherent in prior art electron beam test probe system. In prior art electron beam test probe systems, the wafer 27 is positioned with respect to the probe card 28 and then the combination of the wafer 27 and probe card 28 is moved relative to the electron beam column which remains fixed in position. As pointed out above, it is difficult to move the wafer and probe card together without breaking the electrical contacts between the probes on the probe card and the integrated circuit being tested. The present invention avoids this problem by providing a means for moving the wafer relative to the probe card which is independent of the means used to move the electron beam column relative to the probe card. Hence, once the wafer 27 is correctly positioned relative to the probe card 28 by adjusting the positioning means on the stage 26, it may remain fixed, since the electron beam column 29 is separately positionable relative to the wafer 27 and probe card 28 using positioning means 40.

Second, prior art electron beam test probe systems required that the wafer and probe card be inserted together into the vacuum chamber along a direction parallel to the planar surface on which the electron beam test probe is mounted. In these prior art systems, the electron beam column is located on top of a chamber in which the wafer and probe card are placed, the chamber in question being located on top of a planar surface. The electron beam travels in a downward direction, entering this chamber and striking the integrated circuit after passing through the probe card, the positioning means for moving the wafer and probe card being located under the wafer. This type of limited access to the probe card and positioning means complicates the insertion of the wafer into the electron beam test probe and its positioning relative to the probe card. In addition, it makes it difficult to change the probe card and stage setup if one wishes to test an integrated circuit which is not part of a wafer, e.g., an integrated circuit mounted on a carrier which receives its signals thought pins which are inserted in a socket.

The present invention avoids this problem by mounting the electron beam column 29 on the underside of the surface 25. This allows the vacuum boundary 46 to be completely removed, thus allowing substantially improved access to the probe card 28 and stage 26. Further, by using interchangeable vacuum boundaries 46, the operations needed to change stages are substantially reduced. Here, each stage is mounted on a separate vacuum boundary 46. Hence one need only remove one stage vacuum boundary combination and replace it with another such combination to affect a change in integrated circuit mounting means.

Figure 3:
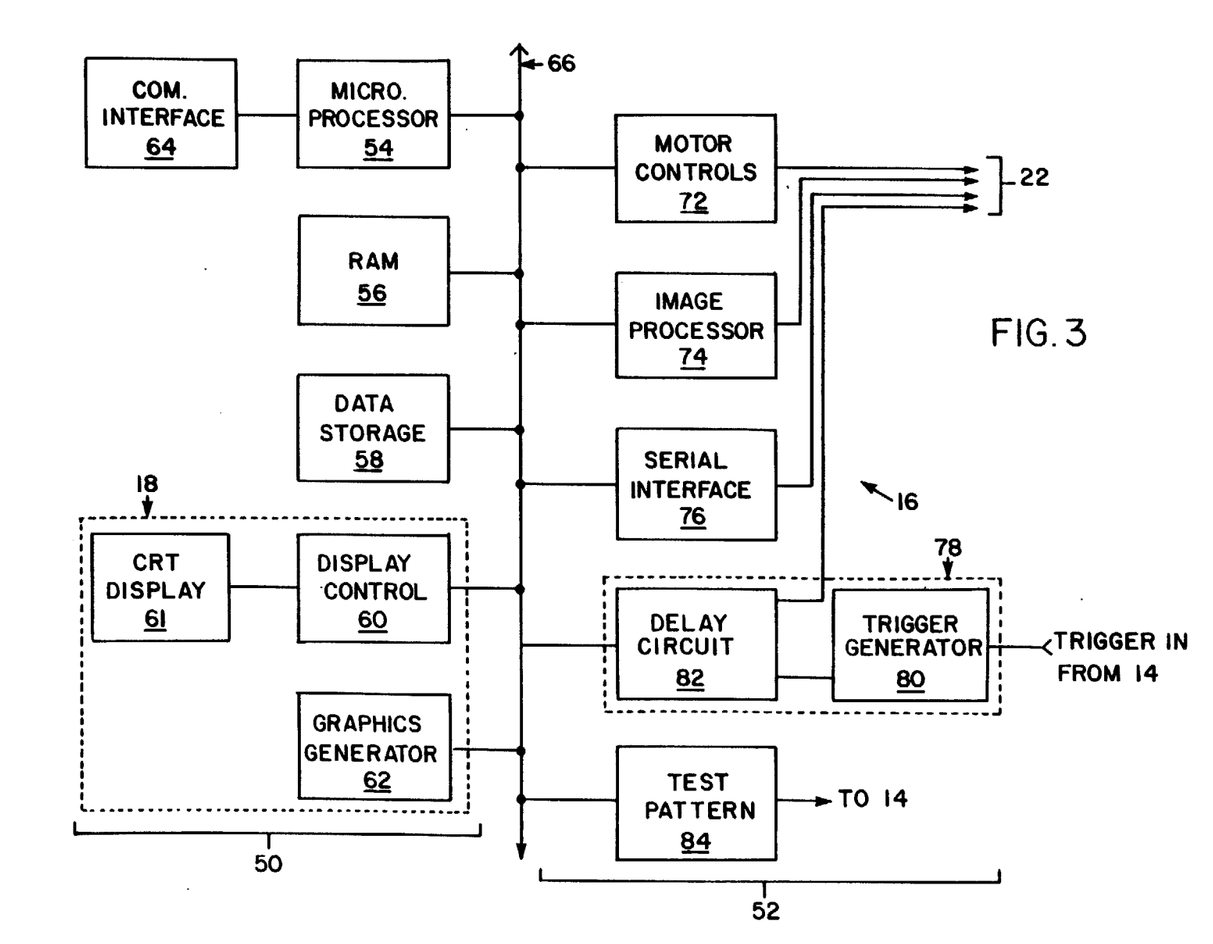
FIG. 3 is a block diagram of the data processing system used in the electron beam test probe system illustrated in FIG. 1.

A block diagram of the data processing system 16 is shown in FIG. 3. The data processing system 16 may be divided into two broad functional groups, a computing system 50 and an electron beam test probe control system 52. The computing system 50 must be capable of storing, processing and displaying high resolution images of the surface of the integrated circuit being tested. In addition, it must store, process and display schematic diagrams and simulated images of the surface of the integrated circuit which are calculated from the schematic and layout data used in the fabrication of said integrated circuit. In the preferred embodiment, the computer system 50 includes a microprocessor 54, a 2 megabyte RAM memory 56, and a data storage module 58 having a storage capacity of at least 140 megabytes. Preferably, data storage module 58 is a disk drive. In addition, the computer system 50 includes a display terminal 18 having a display interface 60 for driving a high resolution color display terminal 61 having a resolution of at least 1000 lines. The display terminal 18 also includes a keyboard for inputing commands and a pointer means for specifying points on the display screen. To improve the time needed to produce a graphic display, the display terminal 18 also includes its own graphics generator 62 in the preferred embodiment. In addition, the preferred embodiment of the computing system 50 includes interfaces 64 for communicating with other computer systems. These components are coupled to a communication bus 66.

The electron beam test probe control system 52 includes a number of interface circuits used to communicate with the electron beam test probe 12 and the circuit exerciser 14. The various stepping motors in the electron beam test probe 14 are controlled though a conventional motor interface circuit 72. This interface allows the computer system to position the electron beam column 29 with respect to the integrated circuit 30. In embodiments in which the stage 26 also includes stepping motor for positioning the wafer 27 containing said integrated circuit with respect to the probe card 28, these latter stepping motors are also controlled through this interface.

The second interface circuit is an image processor 74 which is used to position the electron beam using the second positioning means 41 in the electron beam test probe system. This interface is used to set the currents in the deflection coils contained in said positioning means 41. In addition, the image processor 74 is used to input the signal from the secondary electron detector 46 which is related to the measured potential on the integrated circuit at the point on the integrated circuit at which the electron beam bombards said integrated circuit.

The third interface circuit 76 is a conventional serial interface for setting the various operating parameters of the electron beam column 29. These operating parameters include the potential used to accelerate the electron beam, the currents in various alignment coils used to align the electron beam along the electron beam column axis 36, and the currents in the various focusing lens in the electron beam column optical system. These parameters are described in detail in the co-pending application referred to above (Ser. No. 766,905).

The fourth interface circuit 78 is used to control the blanking electrodes 38 in the electron beam column 29. The blanking electrodes 38 are used to specify a time at which the potential measurements are made relative to the test signal pattern which is applied to the integrated circuit being tested. The time needed to make a potential measurement is generally much longer than the time span over which the test signal pattern remains constant. Hence, stroboscopic techniques must be used. In a stroboscopic system, the electron beam is turned on for a short period of time at the same point in the test signal pattern. Each time the electron beam is so pulsed, a measurement of the potential on the integrated circuit is made. This measurement has insufficient statistical accuracy to allow an accurate determination of the potential on the integrated circuit; however, an average of a number of such measurements does have sufficient accuracy. Hence, the apparatus of the present invention averages a number of potential measurements made at the same point in the test signal pattern. This is accomplished by generating a trigger pulse from the test signal pattern generated by exerciser 14 using a trigger generator 80. Said trigger pulse defines a specific point in the test signal pattern. The electron beam is then pulsed at a precise time after the receipt of this trigger pulse. This time is defined by a delay circuit 82 which applies the trigger pulse to the blanking electrodes 38 after a delay specified by the computing system 50 on bus 66. This trigger pulse system is described in detail in the copending application referred to above (Ser. No. 766,905).

Finally, the fifth interface circuit 84 allows the computer system 50 to communicate with the circuit exerciser 14. This interface circuit provides a means for controlling the specific test signal pattern which is applied to the various input connections on the integrated circuit under test. It may also be used to read the potentials on the various output connections on said integrated circuit. The circuit exerciser 14 and interface circuit 84 are conventional.

Data Files Used by the Present Invention

Four data files are entered into the computing system 50 prior to testing of an integrated circuit. These four files define the schematic diagram of the circuit, a layout diagram for the integrated circuit, a correspondence table which associates each circuit element in the schematic with one or more elements in the layout diagram, and a test signal pattern to be applied to the integrated circuit by the circuit exerciser 14.

The first data file specifies the schematic diagram of the circuit fabricated on the integrated circuit. Such files are used as input to circuit simulation programs such as the SPICE program developed at the University of California at Berkeley, Ca. Typically, circuit designers use such simulation programs to test a circuit design prior to making masks for fabricating the circuit in question. Several formats for data files specifying schematic diagrams currently exist in the art. In addition to the SPICE format, the present invention can access schematic files in the TEGAS format used by the TEGAS circuit simulator sold by CALMA inc. of San Jose, CA, and the EDIF format which is intended to be a standard format for the industry. The EDIF format is described in detail in EDIF Electronic Design Interchange Format, Version 100, the EDIF user's group, Design Automation Department, Texas Instruments, P.O. Box 225474, MS3668, Dallas, Texas, 75265 which is incorporated herein by reference.

The second data file specifies the layout of the integrated circuit on the wafer on which it is fabricated. This file is used to generate the various masks which are used in the fabrication process. In general, an integrated circuit fabricated using a series of deposition and etching steps to define the circuit elements specified in the schematic diagram. For example, a conductor connecting two terminals would be specified by placing a polygon which overlaps the two terminals in question into the masks or masks which are used for depositing a metal layer on the surface of the wafer. A transistor would be specified by overlapping polygons located in several different masks. The present invention is capable of reading layout diagram files created for any of a number of standard mask generation programs. The preferred embodiment utilizes layout data files created in the Apple 860 format used by the APPLICON work station program available from APPLICON, Inc., Burlington, MA., and the CALMA GDS2 format used by the CALMA GD52 work stations sold by CALMA, Inc.

It should be noted that the circuit elements present in the schematic diagram are labeled in a different manner than the corresponding elements in the layout data file. A transistor the schematic diagram will in general be a labeled circuit element, i.e., transistor 7. The same transistor in the layout data file will be represented by overlapping polygons on several masks, e.g., polygon 10 on mask 1, and polygon 29 on mask 2, etc. Without a means for determining the correspondence between elements in the schematic diagram and the corresponding polygons in the layout data, it is difficult to use the layout data to locate a given circuit element on the surface of the wafer.

The correspondence table which comprises the third data file mentioned above provides this means. In principle, the circuit designer has the relevant information for producing a correspondence table between the schematic diagram and the layout diagram as represented in the first two files; however, inputting this table manually would be a time consuming task for an integrated circuit with millions of transistors and conductors. The present invention relieves the circuit designer of this task by making use of previously unutilized data generated by such design verification programs to generate this correspondence table.

More specifically, as pointed out above, after an integrated circuit design has been tested in a circuit simulator such as SPICE, and the mask generation program file created for the integrated circuit, it is important to verify that the circuit specified in the schematic is in fact the same as that specified in the mask generation program file. This step is needed to be sure that no errors occurred in entering the information contained in the schematic diagram in mask form. Since the number of circuit elements on a typical integrated circuit is very large and the placement of the various circuit elements on the wafer is, in general, significantly different from the placement of the corresponding elements in the schematic diagram, it is difficult to make this verification visually. Hence, design verification programs have been created to perform this verification process in an automated manner.

The generation of this correspondence table may be more easily understood with reference to the manner in which a typical design program, DRACULA, performs its verification functions. The DRACULA program is available from ECAD, Inc. of Santa Clara, CA. In the course of performing its design verification tasks, the DRACULA program generates a correspondence table which gives the relationship between each element in the SPICE schematic data file and the circuit elements described by polygons in the layout data file. The input to the DRACULA program consists of three data files, the first two being the SPICE formatted schematic data file and the layout data file used to generate the fabrication masks. The third data file specifies how each circuit element is created from overlapping polygons in different layers of the layout data file. Using the layout data file and this third file, the DRACULA program assigns circuit element labels to the various overlapping polygons and then assigns a physical location to each such element. It also produces a layout NET list specifying the connections between each of these elements. This layout NET list is then compared with the corresponding schematic NET list in the schematic data file. If no errors were made in inputting the layout data, there should be one element in the layout NET list for each element in the schematic NET list.

To make this comparison, the program must first produce a correspondence table which associates each element in the schematic NET list with an element in the layout NET list. The "name" assigned to each circuit element in the layout NET list will, in general, be different from the name assigned to the same element in the schematic NET list, since the design verification program assigns names to the circuit elements in relation to their location on the wafer surface. To build this correspondence table, the design verification program compares the connections made to a specific circuit element with those made to each circuit element in the schematic NET list. This comparison process starts with the circuit elements which are connected to the input and output pads located around the periphery of the integrated circuit, since these elements are easily identified in both NET lists. Once these are correctly assigned, the circuit elements connected to these are assigned names, and so on.

In its normal mode of operation, the DRACULA program reports only the discrepancies between the two NET lists. However, a modified version of the DRACULA program is available from ECAD, Inc., which outputs the internal correspondence table which associates each circuit element in the schematic data file with one or more polygons in the layout data file. This correspondence table is the third data file which is inputted to the present invention.

The fourth data file which is inputted to the present invention specifies the test signal pattern to be used by the circuit exerciser 14. This file specifies the signals which are to be applied to the various inputs of the integrated circuit under test and the timing of these signals relative to each other.

A key feature of the present invention is its ability to locate a specific circuit element on the surface of the integrated circuit by reference to said circuit element in terms of its location in the schematic diagram of the integrated circuit. When an engineer must find the source of a malfunction in the integrated circuit, he normally chooses a circuit element in the schematic diagram which he suspects to be the source of the malfunction. He then examines the signals on various input and output terminals of this circuit element using an electron beam test probe. Prior art electron beam test probe systems required him to determine the coordinates of the location on the integrated circuit surface of each of these input and output terminals. He then had to position the electron beam at each of these coordinates on the integrated circuit surface in order to observe the signals in question. This was a time consuming and error prone procedure.

The present invention automatically performs this positioning function. The display terminal 18 is used to display the portion of the schematic diagram which contains the circuit element in question. Using a light pen or other pointing device, the engineer points to the desired circuit element. The data processing system 16 uses the correspondence table described above to determine which of the polygons in the layout diagram correspond to the circuit element in question. The coordinates of these polygons are determined using the layout data file described above. The electron beam column 29 is then positioned such that the portion of the integrated circuit surface fabricated using these polygons is within the field of view of the electron beam column 29. The portion of the layout diagram corresponding to this field of view is also displayed on the display terminal 18 together with an image of the surface of the integrated circuit which is within said field of view. By specifying a coordinates of a point on the layout diagram using the light pen, the engineer can cause the electron beam to be directed at that point on the integrated circuit surface. The potential as function of time at said point on the integrated circuit surface may then be displayed on the display terminal 18.

Displays Generated by the Present Invention

Figure 4:
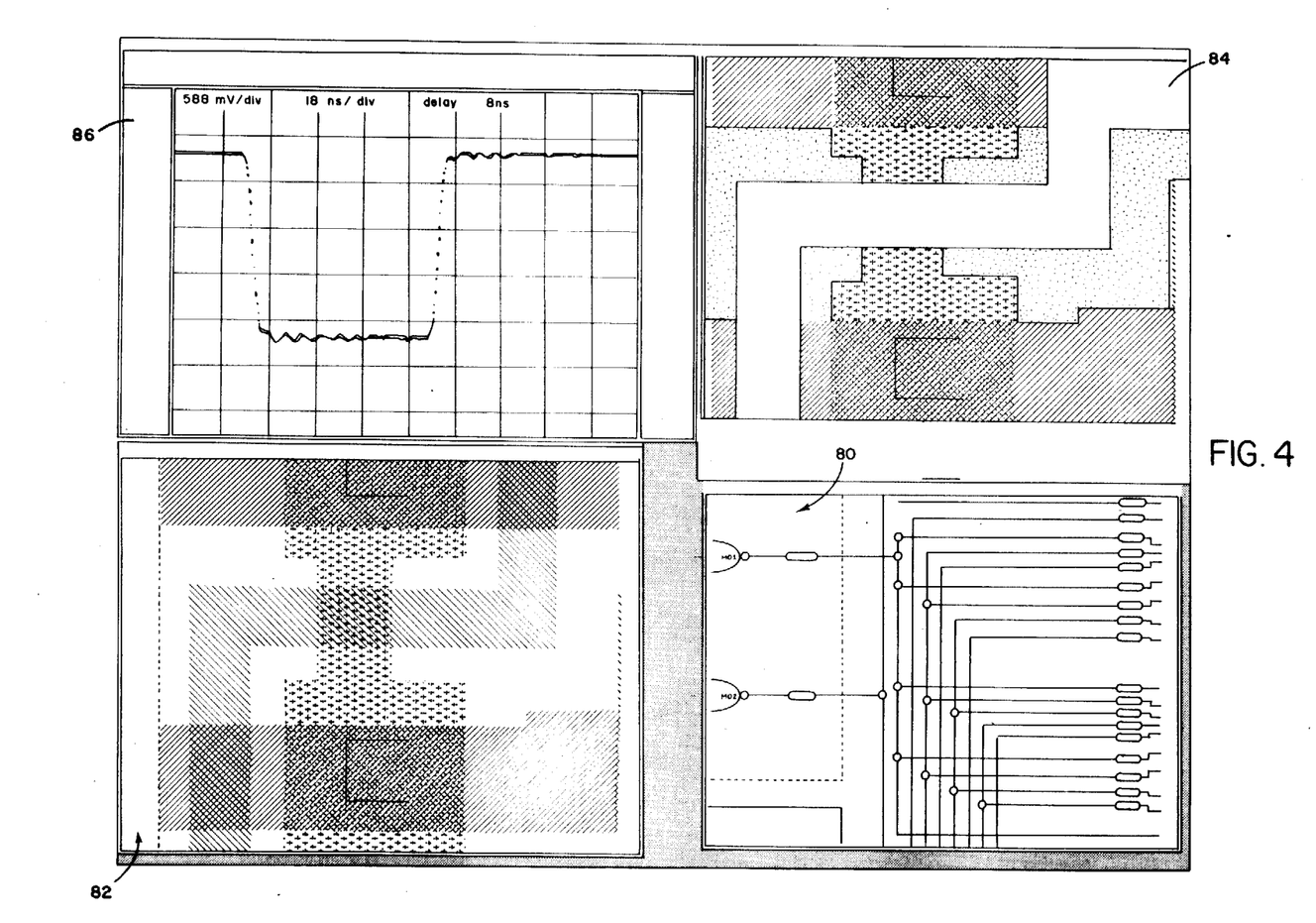
FIG. 4 is a typical display produced by the present invention.

A typical display generated display terminal 18 by the apparatus of the present invention is shown in FIG. 4. This display consists of four frames. The first frame 80 shows a portion the schematic diagram of the integrated circuit being tested. The engineer specifies a specific circuit element by pointing to a location in this frame using a light pen or other pointing device.

The portion of the layout diagram which contains the masks used to fabricate this circuit element is then displayed in second frame 82. The polygons on different masks are cross hatched using different patterns to aid the engineer in interrupting this diagram. He can position the electron beam so that it bombards a specific point on the surface of the integrated circuit by indicating a location on this layout diagram using said pointing device.

An electron beam generated image of the surface of the integrated circuit corresponding to the portion of the layout diagram displayed in the second frame is shown in the third frame 84. This image is shaded in relation to potential detected at each point on the integrated circuit surface, regions of high potential being of a lighter shade than regions of lower potential. To aid the engineer in comparing this image with the layout diagram, the layout diagram may be superimposed on this image. Such a super position is illustrated in frame 84 of FIG. 4.

The potential as a function of time at the point specified by the engineer is shown in the fourth frame 86 shown in FIG. 4. The display format is chosen to be the same as that used by conventional oscilloscopes. It consists a graph of of the potential at said point as function of time for times in a time interval specified with respect to the test signal pattern applied to the integrated circuit. The test signal pattern and time interval may be altered by commands inputted to the display terminal 18.

The apparatus of the present invention may be used in either a manual or a semi-automated mode to debug an integrated circuit. In the manual mode, the test engineer chooses a circuit element in the schematic to be displayed. This circuit element is usually suggested by the type of malfunction which has been observed. The data processing system 16 then positions the electron beam test probe 12 so that the field of view of the electron beam column 29 is centered on the circuit element in question. The data processing system 16 also generates a layout data image of this region of the integrated circuit so that the image of the surface of the integrated circuit in the field of view may be compared with that expected from the layout data. This comparison is useful in detecting fabrication errors such as a malformed circuit element. The design engineer may then display the potential as a function of time at any point in the field of view. From this data, the test engineer can then determine whether the source of the malfunction is indeed in this area of the integrated circuit. If not, he chooses a new point, either with respect to the layout data or with respect to the schematic, and the process is repeated.

In its semi-automatic mode, the apparatus of the present invention can find the areas of the wafer which are not behaving as expected. This is accomplished by inputting the expected value for the average potential measured at each point on the integrated circuit surface to the data processing system 16. Such data may be generated using a circuit simulation program. The apparatus of the present invention then compares the measured average potentials used to generate the image described above with this simulation data for each field of view on the integrated circuit. Areas of the wafer which do not conform to the expected values are displayed to the test engineer on the display terminal 18. The portion of the schematic diagram containing specific circuit elements may be displayed by indicating a location in the layout image. The data processing system 16 determines the circuit element which is located at this point on the integrated circuit from the layout data and then finds this circuit element in the schematic diagram. The element in question is then displayed together with the circuit elements surrounding it in the schematic diagram.

Various modifications will be apparent to those skilled in the art without departing from the present invention as claimed.

What is claimed is:

1. An electron beam test probe system for analyzing an integrated circuit said analysis including the measurement of the potential at selected points on said integrated circuit, said electron beam test probe system comprising:
   means for generating a test signal pattern and for coupling said test signal pattern to said integrated circuit;
   point specifying means for specifying a point on said integrated circuit, said point specifying means including means for inputting and storing a layout diagram of said integrated circuit in a layout format consistent with that used by a mask design program and means for manually specifying a location on said integrated circuit with reference to said layout diagram;
   electron beam test probe means for measuring said potential on said integrated circuit at said specified point and for generating an image of the surface of said integrated circuit in a region surrounding said specified point; and
   display means for displaying said measured potential and said image.

2. The electron beam test probe system of claim 1 wherein said electron beam test probe comprises:
   electron beam column means for bombarding said integrated circuit at a point on the surface of said integrated circuit with an electron beam having an axis parallel to a predefined axis, said bombardment generating secondary electrons, wherein said electron beam column means further comprises means for sensing the secondary electrons produced in response to said bombardment and means for deflecting said electron beam in either of two orthogonal directions, each of which being substantially orthogonal to said electron beam axis;
   probe card means for coupling said test signal pattern to said integrated circuit, said probe card means including an orifice through which said electron beam passes;
   column positioning means for moving said electron beam column means relative to said probe card means; and
   stage means for moving said integrated circuit relative to said probe means.

3. The electron beam test probe system of claim 2 wherein said stage means comprises:

means for moving said integrated circuit in either of two orthogonal directions, each of which being substantially orthogonal to said electron beam axis;

means for moving said integrated circuit in a direction parallel to said electron beam axis; and means for rotating said integrated circuit about an axis substantially parallel to said electron beam axis.

4. The electron beam test probe system of claim 2 wherein said column positioning means comprises means for moving said integrated circuit in either of two orthogonal directions, each of which being substantially orthogonal to said electron beam axis;

5. The electron beam test probe system of claim 2 further comprising:

a surface having an orifice through which said electron beam passes;

probe card mounting means for mounting said probe card over said orifice in a fixed position relative to said surface;

stage mounting means for mounting said stage means in a fixed position relative to said surface;

first vacuum boundary means comprising a chamber bounded by said surface, said chamber surrounding said stage means and having a removable cover for gaining access to said stage means;

electron beam column mounting means for mounting said column positioning means in a fixed position relative to said surface on the opposite side of said surface from said stage mounting means; and second vacuum boundary means for maintaining a vacuum in said electron beam column; said second vacuum boundary means including bellows means connected to said electron beam column means and said surface for maintaining a vacuum surrounding said integrated circuit and said electron beam when said electron beam column means is moved relative to said probe card means using said column positioning means; wherein said electron beam exits from said electron beam column means along a direction substantially perpendicular to said surface, said electron beam passing through said orifices in said surface and said probe card means and then striking said integrated circuit.

6. The electron beam test probe system of claim 2 wherein said electron beam column means further comprising:

blanking electrode means for turning said electron beam on and off at times specified with respect to said test signal pattern.

7. The electron beam test probe system of claim 2 wherein said electron beam column means further comprises:

means for generating a trigger pulse from said test signal pattern; and delay means for turning on said electron beam after a predetermined time has elapsed after the generation of said trigger pulse.

8. The electron beam test probe system of claim 1 wherein said point specifying means further comprises:

means for inputting and storing a schematic diagram of said integrated circuit in a schematic format consistent with that used by a circuit simulation program;

means for inputting and storing a correspondence table defining the location of each circuit element in said integrated circuit on the surface of said integrated circuit; and means for specifying a point in said schematic diagram.

9. The electron beam test probe system of claim 8 wherein said schematic format comprises the SPICE circuit simulation program format.

10. The electron beam test probe system of claim 8 wherein said schematic format comprises the EDIF format.

11. The electron beam test probe system of claim 8 wherein said schematic format comprises the TEGAS circuit simulation program format.

12. The electron beam test probe system of claim 1 wherein said layout format comprises the APPLE 860 format.

13. The electron beam test probe system of claim 1 wherein said layout format comprises the CALMA GDS2 format.

14. The electron beam test probe system of claim 8 wherein said display means comprises:

means for displaying a schematic diagram;

means for displaying a layout diagram;

means for displaying an image of the surface of said integrated circuit; and means for displaying the potential at a specified point on said integrated circuit surface as function of time for a time period between a first and second selected time specified with reference to said test signal pattern.

15. The electron beam test probe system of claim 14 wherein said image displaying means includes means for displaying an image of the surface of said integrated circuit in which the intensity of each point in said image is a function of the potential on said integrated circuit surface at a corresponding point.

16. The electron beam test probe system of claim 15 wherein said potential is measured at a fixed time relative to said test signal pattern.

17. The electron beam test probe system of claim 15 wherein said potential is the average of potentials measured at substantially random times relative to said test signal pattern.

18. The electron beam test probe system of claim 15 wherein said potential is the time averaged potential at said point on said integrated circuit.

19. The electron beam test probe system of claim 15 further comprising means for comparing an image of a region of said integrated circuit surface with a simulated image of said integrated circuit surface.

* * * * *

UNITED STATES PATENT AND TRADEMARK OFFICE
CERTIFICATE OF CORRECTION

PATENT NO. : 4,706,019

DATED : November 10, 1987

INVENTOR(S) : Neil Richardson

It is certified that error appears in the above-identified patent and that said Letters Patent is hereby corrected as shown below:

Column 10, line 43, after "circuit" insert --is--.

Column 10, line 48, delete "masks or masks" and insert therefor --mask or masks--.

Column 10, line 63, after "transistor" insert --in--.

Column 11, line 10, after "two" insert --data--.

Column 13, line 3, after "generated" insert --on the--.

Column 13, line 6, after "portion" insert --of--.

Column 13, line 12, after "in" insert --the--.

Column 13, line 34, after "graph" delete "of" and after "consists" insert --of--.

Column 14, line 66, after "probe" insert --card--.

Signed and Sealed this

Twenty-eighth Day of June, 1988

Attest:

DONALD J. QUIGG

*Attesting Officer*

*Commissioner of Patents and Trademarks*